United States Patent
Deimling (10) Patent No.: US 7,725,156 B2
(45) Date of Patent: May 25, 2010

(54) MAGNETIC RESONANCE TOMOGRAPHY APPARATUS AND METHOD FOR REPRESENTATION OF TISSUE WITH VERY SHORT $T_2$ RELAXATION TIME

(75) Inventor: Michael Deimling, Möhrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 1203 days.

(21) Appl. No.: 11/154,198

(22) Filed: Jun. 16, 2005

(65) Prior Publication Data

US 2006/0036154 A1 Feb. 16, 2006

(30) Foreign Application Priority Data

Jun. 16, 2004 (DE) ............ 10 2004 029 025

(51) Int. Cl.
*A61B 5/05* (2006.01)
*G01V 3/00* (2006.01)
(52) U.S. Cl. .............. 600/410; 324/309; 324/313
(58) Field of Classification Search .......... 600/410; 324/309, 313
See application file for complete search history.

(56) References Cited

U.S. PATENT DOCUMENTS

| | | | | |
|---|---|---|---|---|
| 5,034,692 | A | * | 7/1991 | Laub et al. ............ 324/309 |
| 6,366,090 | B1 | | 4/2002 | Heid |
| 6,671,536 | B2 | * | 12/2003 | Mistretta ............ 600/410 |
| 6,677,750 | B2 | | 1/2004 | Hennig et al. |
| 6,891,373 | B2 | * | 5/2005 | Deimling ............ 324/309 |
| 7,253,620 | B1 | * | 8/2007 | Derbyshire et al. ...... 324/307 |
| 2007/0080685 | A1 | * | 4/2007 | Bydder et al. ............ 324/309 |

OTHER PUBLICATIONS

Flask et al. A method for fast 3D tracking using tuned fiducial markers and a limited projection reconstruction FISP (LPR-FISP) sequence. J Magn Reson Imaging 2001; 14(5): 617-627.*
Shea et al. Three-dimensional true-FISP imaging of the coronary arteries: Improved contrast with T2-preparation. J Magn Reson Imaging 2002; 15(5): 597-602.*
Hardy et al., Optimization of a Dual Echo in the Steady State (DESS) Free-Precession Sequence for Imaging Cartilage, JMRI 1996; vol. 6, p. 329-335.*
"Fast T2-Weighted MR Imaging: Impact of Variation in Pulse Sequence Parameters on Image Quality and Artifacts," Li et al, Magnetic Resonance Imaging, vol. 21 (2003) pp. 745-753).
"A New Steady-State Imaging Sequence for Simultaneous Acquisition of Two MR images with Clearly Different Contrasts," Bruder et al. Magnetic Resonance in Medicine, vol. 7, (1988), pp. 35-42.

* cited by examiner

*Primary Examiner*—Eric F Winakur
*Assistant Examiner*—Ellsworth Weatherby
(74) *Attorney, Agent, or Firm*—Schiff Hardin LLP (57) ABSTRACT

In a magnetic resonance tomography apparatus and method for determination of T2-weighted images of tissue with short T2 time, in the framework of a steady-state free precession sequence with non-slice-selective RF excitation pulses and projection-reconstruction methods, in each sequence repetition a first steady-state is read out in the form of a half echo and a second steady-state signal is read out in the form of a further half echo with very short echo times $TE_1$ and $TE_2=2TR-TE_1$, and are combined by weighted addition such that an MRT image of tissue with very short T2 time is obtained with the sequence.

11 Claims, 8 Drawing Sheets

MAGNETIC RESONANCE TOMOGRAPHY APPARATUS AND METHOD FOR REPRESENTATION OF TISSUE WITH VERY SHORT $T_2$ RELAXATION TIME

BACKGROUND OF THE INVENTION

1. Field of the Invention

The present invention in general concerns magnetic resonance tomography (MRT) as employed in medicine for examination of patients. The present invention in particular concerns a method and apparatus for high-contrast representation of tissue that exhibits a very short $T_2$ relaxation time (very fast decay of the transverse magnetization $M_{xy}$).

2. Description of the Prior Art

MRT is based on the physical phenomenon of nuclear magnetic resonance and has been successfully used as an imaging modality for over 20 years in medicine and biophysics. In this examination modality, the subject is exposed to a strong, constant magnetic field. The nuclear spins of the atoms in the subject, which were previously randomly oriented, are thereby aligned. Radio-frequency energy now can excite these "ordered" nuclear spins to a specific oscillation. In MRT, this oscillation generates the actual measurement signal that is acquired by means of appropriate reception coils. By the use of non-homogeneous magnetic fields generated by gradient coils, the measurement subject can be spatially coded in all three spatial directions, which is generally designated as "spatial coding".

While the image contrast of an image in x-ray computed tomography (CT) depends only on the electron density of the irradiated tissue, the magnetic resonance signal and therewith the character of the MR image is mainly determined by the intrinsic tissue parameters p, T1 and T2. p is the proton density, T1 characterizes the design of the longitudinal magnetization $M_z$ and T2 characterizes the decay of the transverse magnetization $M_{xy}$.

In order to prevent erroneous interpretations of MR images, in the clinical routine a number of MR images with different acquisition parameters are always acquired that are selected such that the image contrast of the individual images is mainly determined by a single tissue parameter. Such images are known as T1-, T2- or p-weighted images. It is also possible to go a step farther and calculate "pure" parameter images from a number of MR images that have been acquired with different acquisition parameters.

The advantage obtained by this technique is that the image contrast in most cases is greater for the calculated parameter images than for the weighted exposures. The MR images thus obtained can ultimately be used in order to characterize various normal and pathological tissue.

Conventionally, it is difficult to show tissue with very short $T_2$ relaxation time with sufficiently positive contrast. Hydrogen nuclei that are integrated into relatively immobile macromolecular structures normally contribute little image signal, or no image signal at all, because, given very short T2 times (T2<<TE) the magnetic resonance signal of the transverse relaxation at the point in time of the data acquisition already has decayed to zero.

Typical tissues of this type are primarily encountered in the orthopedic field (ligaments, meniscus in the knee) but also, for example, in the parenchyma of the lungs. For example, all conventional spin echo or gradient echo sequences show ligament tears with only very low intensity, such tears are often visible only in front of a background of fatty tissue. If this is lacking, these structures can be very hard to detect.

SUMMARY OF THE INVENTION

An object of the present invention is to provide a method that enables tissue with very short $T_2$ relaxation times to be shown with high contrast in a simple manner.

This object is achieved according to the present invention by a method to determine T2-weighted images of tissue with short T2 time in MRT imaging, wherein, in a steady-state free procession sequence with non-slice-selective RF excitation pulses and a projection-reconstruction per sequence pass (repetition), a first steady-state signal in the form of a half-echo and a second steady-state signal in the form of a further half-echo with very short echo times $TE_1$ and $TE_2=2TR-TE_1$ are respectively read out and combined by weighted addition, such that an MRT image of tissue with short T2 time is obtained from the sequence.

In a first embodiment of the invention, the projection-reconstruction ensues two-dimensionally in combination with a very short duration 3D gradient in the slice direction.

In a second embodiment of the invention, the projection-reconstruction ensues three-dimensionally based on a spherical distribution function $v(\Theta,\phi,r)$ with $\Theta,\phi,r$ as spherical coordinates.

In a further embodiment of the present invention, the gradient pulses are developed such that the first steady-state signal is a FISP signal and the second stead-state signal is a PSIF signal, or the gradient pulses are developed in all spatial directions such that the first steady-state signal is a True FISP signal and the second steady-state signal if a $T_2$*-weighted True FISP signal.

In the case of a True FISP sequence, the gradient pulses are bipolar and point-symmetrical at TR/2 or even (in a further possible embodiment) multipolar and axially symmetrical at TR/2, whereby the surface area of the gradient pulses of a respective axis overall has the value zero.

In this case, given TR/2 an echo signal can be acquired which can advantageously be used as a navigator signal.

Overall, the sum of the squares of the gradient amplitudes should be constant in the inventive sequence.

First and second steady state signal are respectively reconstructed via a half-Fourier method.

The method is characterized by the short T2 time being in the range of milliseconds, the very short echo times TE1 and TE2 being in the range of multiple hundred milliseconds, the duration of the very short 3D gradient in the range of multiple hundred microseconds, the repetition time TR being in the range of a few milliseconds, $T2_{long}$ being in the range from multiple tens of milliseconds up to seconds.

The above object also is achieved by an MRT apparatus that is suitable for implementation of the method described above.

DESCRIPTION OF THE PREFERRED EMBODIMENTS

Figure 1:
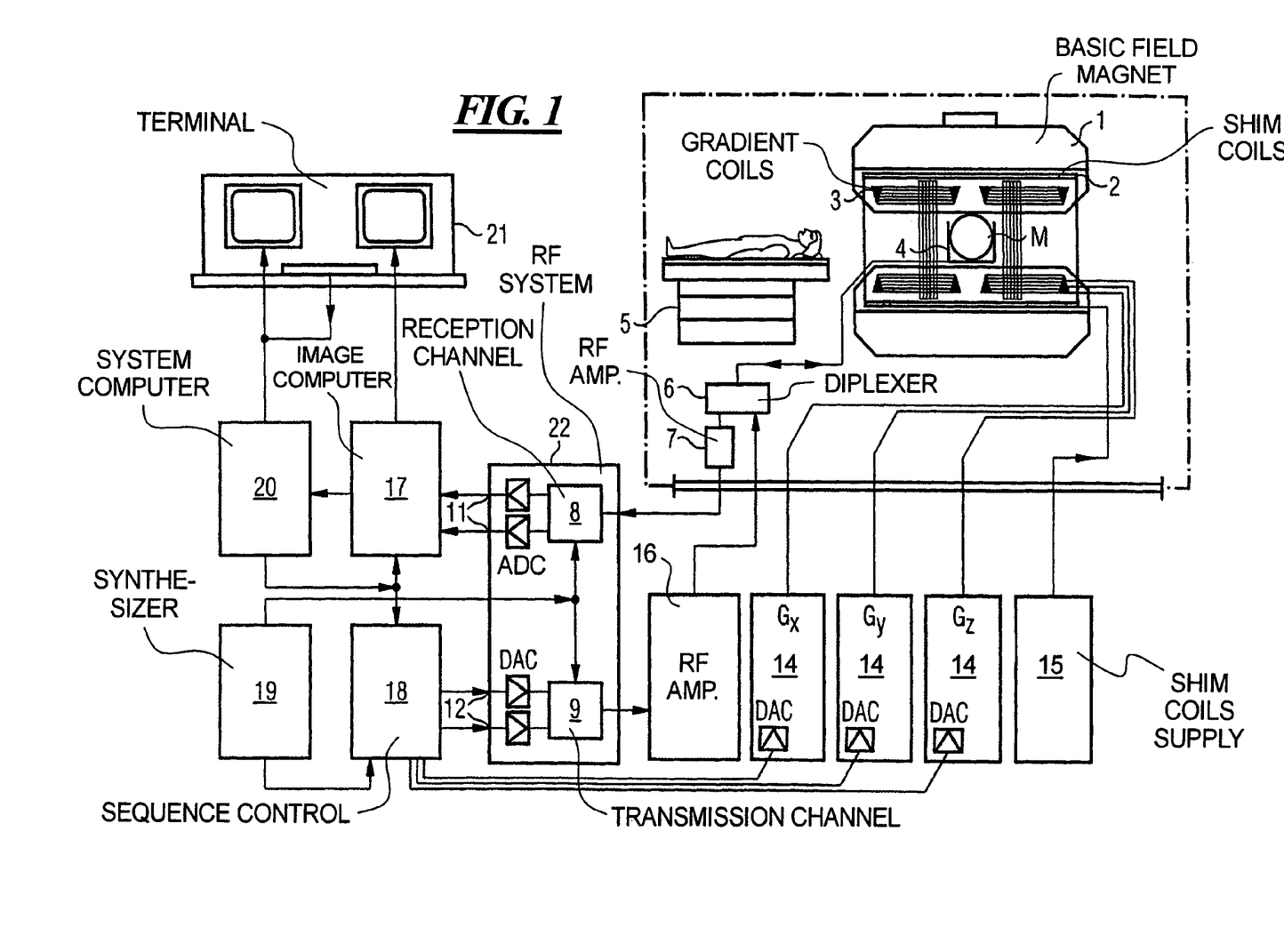
FIG. 1 schematically illustrates a magnetic resonance tomography apparatus constructed and operating according to the invention.

FIG. 1 schematically shows a magnetic resonance tomography apparatus for generation of a magnetic resonance image according to the present invention. The basic design of the nuclear magnetic resonance tomography apparatus corresponds to the design of a conventional tomography apparatus, with the exceptions discussed below. A basic field magnet 1 generates a temporally constant strong magnetic field for polarization or alignment of the nuclear spins in the examination region of a subject such as, for example, a part of a human body to be examined. The high homogeneity of the basic magnetic field necessary for the magnetic resonance data acquisition is defined in a spherical measurement volume M in which the parts of the human body to be examined are introduced. To support the homogeneity requirements, and in particular for elimination of temporally invariable influences, as shim plates made of ferromagnetic material are mounted at a suitable location. Temporally variable influences are eliminated by shim coils 2 that are activated by a shim current supply 15.

A cylindrical gradient coil system 3 that is composed of three coils is disposed in the basic field magnet 1. Each coil is supplied with current by an amplifier 14 for generation of a linear gradient field in the respective direction of the Cartesian coordinate system. The first coil of the gradient field system 3 generates a gradient $G_x$ in the x-direction, the second coil generates a gradient $G_y$ in the y-direction and the third coil generates a gradient $G_z$ in the z-direction. Each amplifier 14 has a digital-analog converter that is activated by a sequence controller 18 for time-accurate generation of the gradient pulses.

Within the gradient field system 3 is a radio-frequency antenna 4 that converts radio-frequency pulses emitted by a radio-frequency power amplifier 30 into a magnetic alternating field for excitation of the nuclei and alignment of the nuclear spins of the subject to be examined or of the region of the subject to be examined. The alternating field emanating from the precessing nuclear spins (normally nuclear spin echo signals caused by a pulse sequence composed of one or more radio-frequency pulses and one or more gradient pulses) is also converted by the radio-frequency antenna 4 into a voltage that is supplied via an amplifier 7 to a radio-frequency receiver channel 8 of a radio-frequency system 22. The radio-frequency system 22 furthermore has a transmission channel 9 in which are generated the radio-frequency pulses for the excitation of the magnetic resonance signals. The respective radio-frequency pulses are digitally represented in the sequence controller 18 as a series of complex numbers based on a pulse sequence predetermined by the system computer 20. This number series is supplied as a real part and an imaginary part via respective inputs 12 to a digital-analog converter in the radio-frequency system 22, and from this to the transmission channel 9. In the transmission channel 9, the pulse sequences are modulated with a radio-frequency carrier signal, the base frequency of which corresponds to the resonant frequency of the nuclear spins in the measurement volume.

Switch-over from transmission mode to reception mode ensues via a transmission-reception diplexer 6. The radio-frequency antenna 4 radiates the radio-frequency pulses into the measurement volume M for excitation of the nuclear spins and samples the resulting echo signals. The correspondingly acquired magnetic resonance signals are phase-sensitively demodulated in the reception channel 8 of the radio-frequency system 22 and are converted into a real part and an imaginary part of the measurement signal in respective analog-digital converter (ADC). An image is reconstructed by an image computer 17 from the measurement data acquired in this manner. The administration of the measurement data, the image data and the control programs ensues with a system computer 20. Based on a requirement with control programs, the sequence controller 18 monitors the generation of the desired pulse sequences and the corresponding sampling of k-space. The sequence controller 18 controls the time-accurate switching of the gradients, the emission of the radio-frequency pulses with defined phase and amplitude and the receipt of the magnetic resonance signals. The time base for the radio-frequency system 22 and the sequence controller 18 is provided by a synthesizer 19. Selection of corresponding control programs for generation of a magnetic resonance image as well as the representation of the generated nuclear magnetic resonance image ensues via a terminal (console) 21 that has a keyboard as well as one or more display screens.

According to the present invention, the magnetic resonance tomography apparatus is operated with a very fast steady-state sequence that is characterized by very short echo times TE. The inventive sequence is implemented in the system computer 20 and is executed by the sequence controller 18.

It is a goal to simultaneously acquire two steady-state free precession signals (SSFP signals) with the inventive sequence that differ from one another primarily in the T2 contrast. By a weighted subtraction of both data sets, tissue with very short T2 thus can be exclusively, positively shown. As used herein "very short" means a range of a few milliseconds, preferably one millisecond. This is explained in detail in the following.

A first possibility for a single sequence to simultaneously acquire two nuclear magnetic resonance signals is the use of a DESS sequence (Dual Echo Steady-State).

Figure 5:
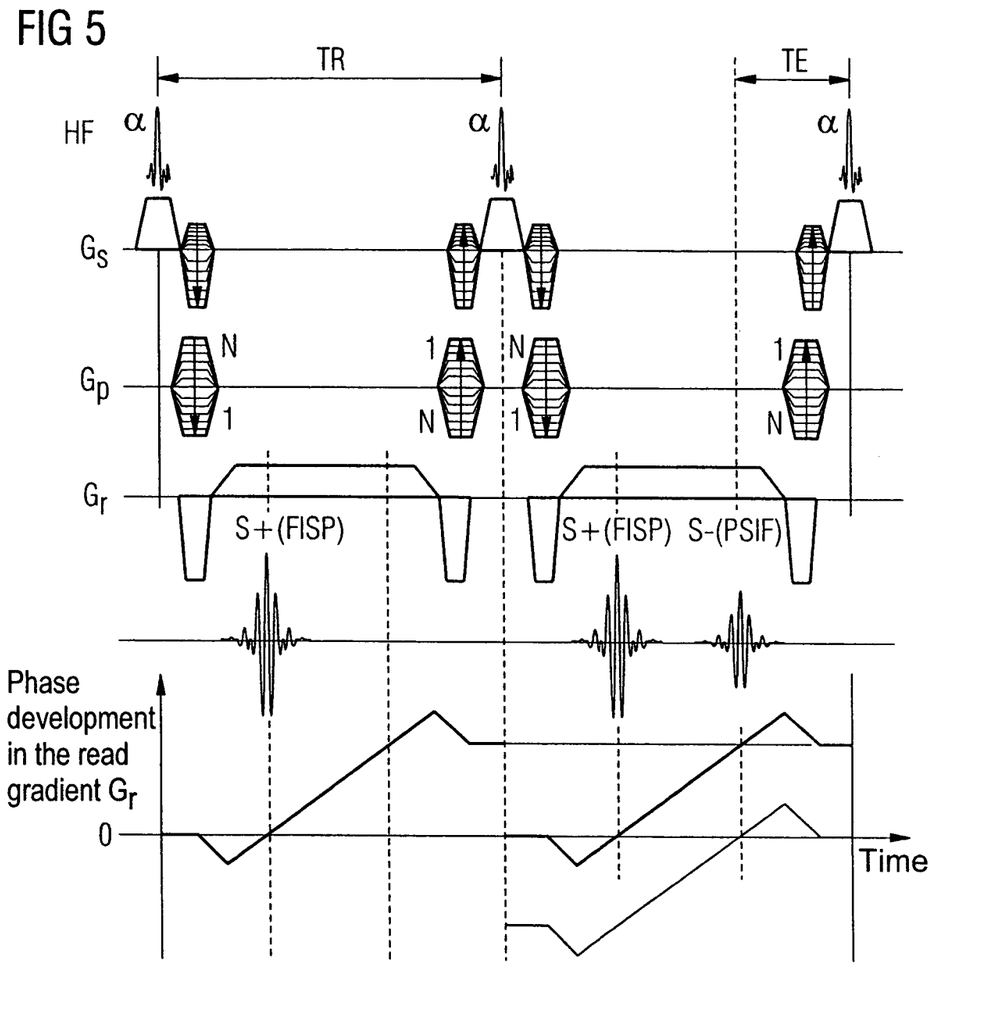
FIG. 5 schematically shows various signal curves in a conventional DESS sequence.

DESS links a FISP (Fast Imaging with Steady Precession) sequence with the additional signal gain of a PSIF sequence. A conventional DESS sequence is shown in FIG. 5. The FISP echo is generated after each excitation pulse a via the first rephased pulse of the readout gradient. FISP inasmuch represents a gradient echo sequence. The dephased and rephased phase curve of the transverse magnetization vector of the FISP excitation is indicated fat in FIG. 5.

The basic idea of FISP is to restore resaturate the transverse magnetization after the signal readout and to use it for the next sequence pass. FISP by itself already generally leads to a good contrast for tissues with different T2 decays. The transverse magnetization, however, is made noticeable only in the subsequent sequence pass when T2 is still long enough or the echo time TE is correspondingly short. The use of a short repetition time TR is linked with this condition.

The PSIF sequence is a backwards-running FISP sequence (therefore the acronym PSIF). In the PSIF technique, use is made of the fact that every RF pulse possesses not only an exciting component but rather also a refocusing component.

If a number of excitations of a PSIF pulse sequence are considered, the excitation of a measurement acts in a refocusing manner on the transverse component (transverse magnetization) of the preceding measurement: the dephasing and rephasing phase curve of the transverse magnetization vector of the PSIF excitation is shown by the thin line in the lower part of FIG. 5. An echo is generated that is read out with the second rephasing part of the readout gradient. Since the PSIF signal that is generated with the first excitation is read out only at the end of the cycle for the second excitation, the echo time is approximately equal to double the repetition time. PSIF exhibits a markedly high T2 weighting (strictly speaking, PSIF is not in the class of gradient echo sequences; rather, here it is a spin echo sequence).

In accordance with the present invention, among other things, the DESS sequence is modified such that exclusively tissue with short T2 is positively shown by an inventive combination of both acquired data sets (data set S+ of FISP and data set S− of PSIF).

This is achieved by the echo times (TE1 for S+ and TE2 for S−) being significantly reduced. Much shorter echo times are achieved with non-selective RF excitation pulses (in the range of hundreds of microseconds, in contrast to several milliseconds in the case of slice-selective RF pulses). Moreover, in the projection-reconstruction technique that is used the typical 2D phase coding gradient (time-consuming in the framework of the conventional spin-warp technique) can be omitted and data for only one-half of each of the echo signals (S+ and S−) have to be acquired.

Figure 2A:
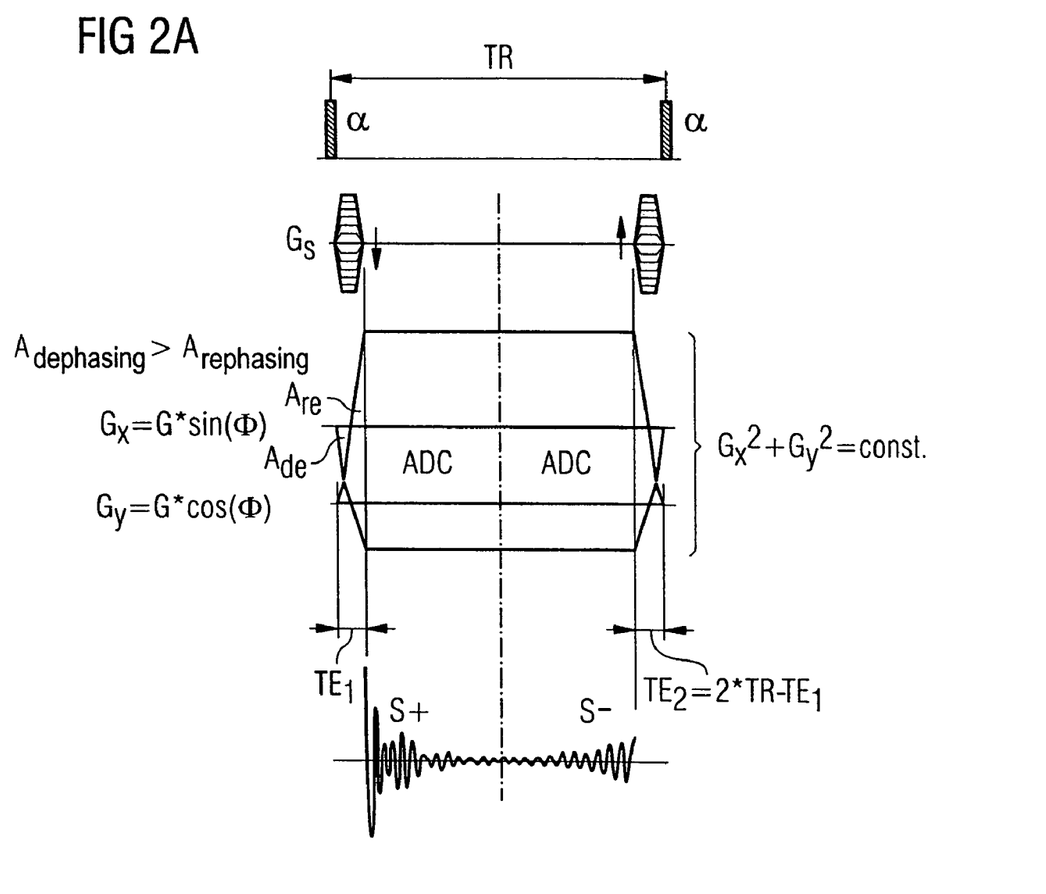
FIG. 2A schematically shows a DESS sequence (Dual Echo in Steady State) with projection gradients in the x-direction and y-direction and a short 3D gradient in the slice direction, suitable for use in the inventive method.

Overall, this leads to a sequence as shown in FIG. 2A. For the aforementioned reasons, this modified DESS sequence represents a very fast steady-state sequence:

The RF pulses are non-slice-selective. The projection-reconstruction method is applied, which is why the typical, clearly longer 2D phase coding gradient can be omitted. In spite of this, in order to acquire thin slices, a very short (in the range of multiple hundred microseconds, preferably 500 μs) 3D gradient that phase-codes the excited volume is activated in the slice direction. Such a short 3D gradient leads to a lower resolution in the slice direction, but this can be accepted in the framework of the present invention. Likewise short, triangular dephasing and rephasing gradient pulses ($A_{de}$, $A_{re}$) are activated in the x-direction and y-direction during the markedly short phase coding by condition $A_{de} > A_{re}$ it is ensured that the signal S+ and the signal S− occurs only after the time TE1 and only before the time TE2=2TR−TE1. The echo times TE1 and TE2 are in the range of several hundreds of microseconds, preferably 300 μs; the repetition time TR lies in the range of a few milliseconds, preferably 3 ms.

Only half of each S+ and S− signal appears in one sequence pass. Each half-echo signal must be reconstructed with a "half-Fourier method". Here the MRT image in the image domain is linked with the acquired MRT data in k-space (frequency domain) by means of a Fourier transformation. In contrast to the two-dimensional or three-dimensional Fourier transformation tomography in the framework of projection reconstruction, a constant gradient G is rotated by small angle increments Δϕ after the slice excitation, so by a projection is generated each time. The reconstruction of an image composed of N×N pixels accordingly requires N independent projections that are defined by N points. The projections thus acquired in polar coordinates can be described in a Cartesian system by two orthogonal gradients $G_x$ and $G_y$, such that:

$$\left. \begin{array}{l} G_x = G\sin\phi \\ G_y = G\cos\phi \end{array} \right\} \text{ with } G_x^2 + G_y^2 = \text{const.}$$

Figure 2B:
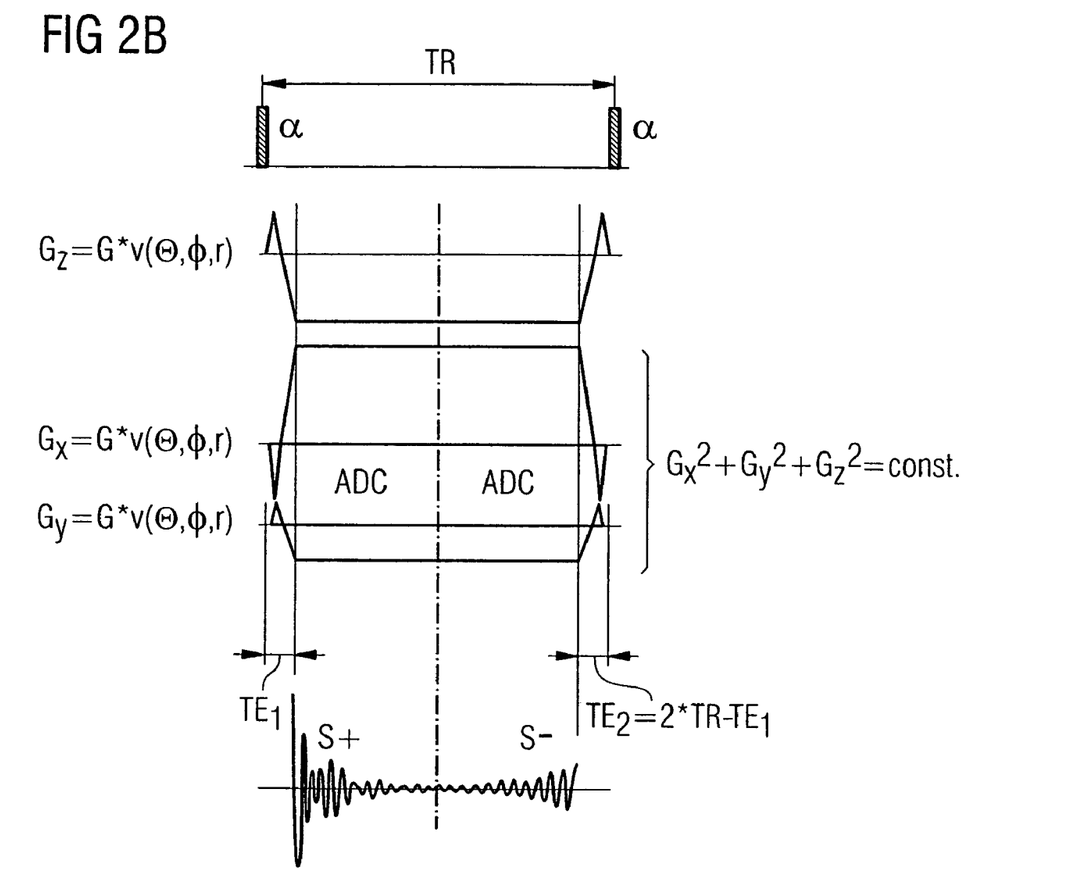
FIG. 2B schematically shows a DESS sequence with projection gradients in all three spatial directions, suitable for use in the inventive method.

Without significantly lengthening the sequence duration, instead of the very short 3D gradient in the slice direction, a spherical sampling can be implemented in the framework of the projection-reconstruction method by simultaneous application of a third projection gradient $G_z$ according to FIG. 2B, the spherical sampling being the gradients $$\left. \begin{array}{l} G_x = G \cdot v(\Theta, \phi, r) \\ G_y = G \cdot v(\Theta, \phi, r) \\ G_z = G \cdot v(\Theta, \phi, r) \end{array} \right\} \text{ with } G_x^2 + G_y^2 + G_z^2 = \text{const.}$$

wherein Θ,ϕ,r represent coordinates (spherical coordinates) and v(Θ,ϕ,r) represent the corresponding distribution function of the sampled trajectories. The incrementing ensues by defined step sizes ΔΘ, Δϕ.

Figure 3:
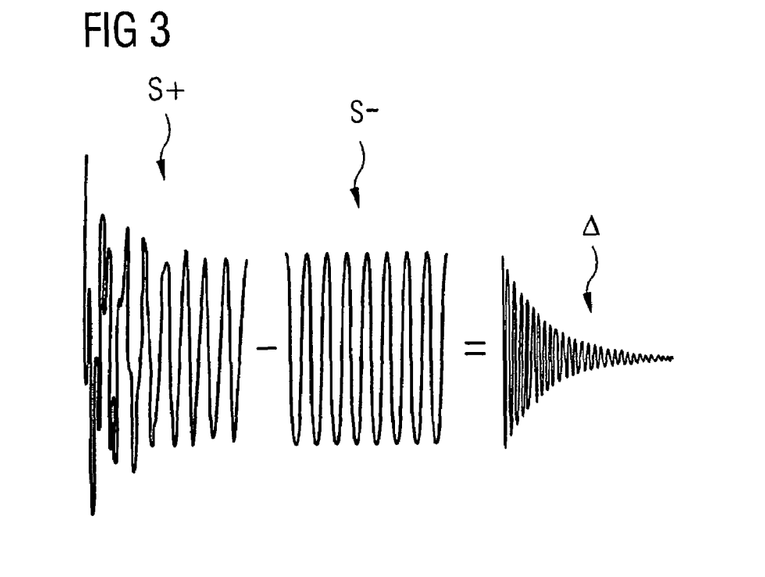
FIG. 3 schematically shows the combination in the form of a subtraction of the steady-state signals that lead to the desired T2 image, in accordance with the invention.

A typical signal curve of the measured data sets S+ and S− is shown in FIG. 3 without the influence of the readout gradient. The dependencies of the acquired echo signals S+ and S− on the amplitudes ($A_{short}$, $A_{long}$) and relaxation times of tissue with temporally short and with temporally long transverse relaxation ($T2_{short}$ and $T2_{long}$) as well as on the sequence-based echo times TE1 and TE2, can be mathematically formulated as follows:

$$S^+ := A_{short} \cdot e^{-\frac{TE_1}{T2_{short}}} + A_{long} \cdot e^{-\frac{TE_1}{T2_{long}}}$$

$$S^- := A_{long} \cdot e^{-\frac{TE_2}{T2_{long}}}$$

Typical values are: $T2_{short}$=1 ms, $T2_{long}$=60 ms, amplitudes $A_{short}=A_{long}$ given an ADC readout time of 1 ms.

The fact that the mathematical expression of S⁻ exhibits no $T2_{short}$ influence follows from the fact that the transverse magnetization of tissue with short T2 is already completely relaxed again at the readout point in time S⁻; in contrast to S⁺ which experiences a clear T2 influence of tissue with short T2 constant after TE1. This T2 influence ($T2_{short}$) can be extracted by suitable parameter selection of the measurement sequence.

If TE1 and TE2 are selected, it then:
$T2_{long} \gg TE_1$ and simultaneously
$T2_{long} \gg TE_2$
The term $$\frac{TE_2 - TE_1}{T2_{long}}$$

(which can be disregarded due to $$\frac{TE_2 - TE_1}{T2_{long}} \ll 1)$$

is thus obtained after the subtraction $S^+-S^-$ by expansion of the terms with $A_{long}$ and $T2_{long}$ in exponents.

The subtraction $S^+-S^-$ thus leads to a "$T2_{short}$ only" image $$\Delta := A_{short} \cdot e^{-\frac{TE_2}{T2_{short}}}$$

which positively shows tissue with very short T2 time in high contrast.

Figure 4:
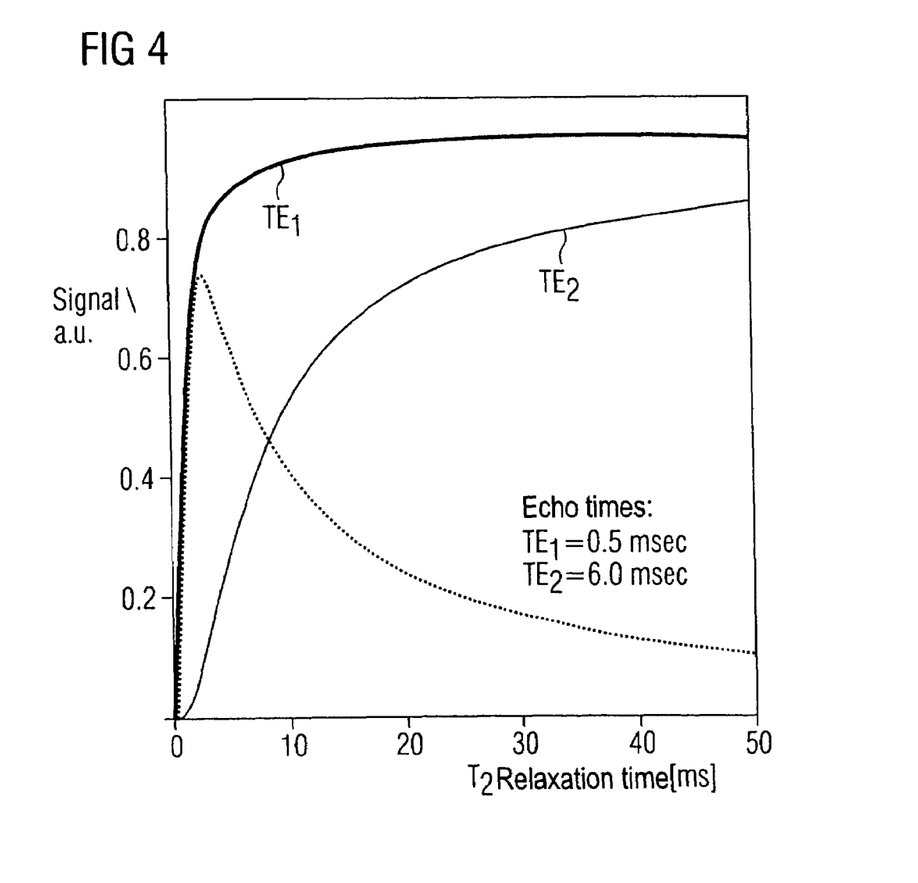
FIG. 4 schematically shows the signal tendency in SSFP sequences and combinations thereof, both dependent on the $T_2$ relaxation time.

The dependency of the signal tendency $\Delta$ on the $t_2$ relaxation time is shown in FIG. 4. The dependencies of the $S^+$ and $S^-$ signals on T2 for different echo times $TE_1$=0.5 ms and $TE_2$=6 ms have a curve that corresponds to that of both solid-line curves. The difference signal (dotted curve) has a clear maximum given very short $T_2$ relaxation times in the range of 2 to 5 ms.

The visualization of tissue with very short $T_2$ relaxation time is thus based on the application of a very fast steady-state sequence in which two signals with different T2 weighting are simultaneously measured. Such a result does not necessarily have to be realized by a modified DESS sequence (according to FIGS. 2A, 2B). Another possibility, these signals can be two SSFP signals that are generated with different echo times, based on the True FISP acquisition technique.

Figure 2C:
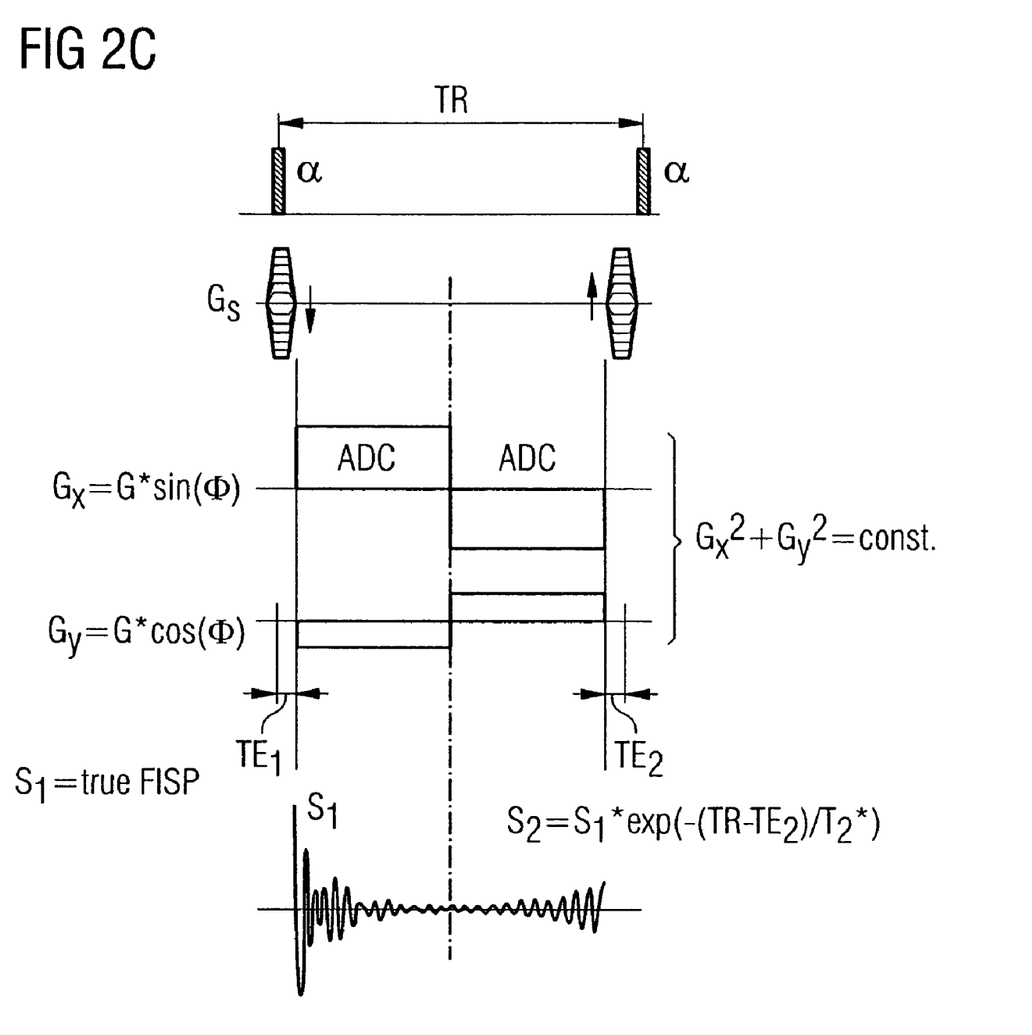
FIG. 2C schematically shows a True FISP sequence with projection gradients in the x-direction and y-direction and a short 3D table in the slice direction, suitable for use in the inventive method.

Such a hybrid True FISP SSFP sequence is shown in FIG. 2C. After a very short non-slice-selective RF excitation pulse, a very short 3D gradient is switched activated) in the slice direction and thus a True FISP signal $S_1$ is subsequently generated that is refocused again by switching two bipolar projection gradients $G_x$ and $G_y$ after the time TR–$TE_2$, and is read out with T2*weighting:

$$S_2 := S_1 \cdot e^{-\frac{TR-TE_2}{T2^*}}$$

(The ramping of the respective gradient pulses are omitted for of clarity.)

Here as well the (two-dimensional) projection-reconstruction method is used ($G_x$=G sin$\phi$, $G_y$=G cos$\phi$ with $G_x^2$+$G_y^2$=constant), whereby for generation of the True FISP signals $S_1$ and $S_2$ it is necessary to design the bipolarity such that the respective gradient surface integral results in zero in every direction:

$$\sum_i G_i \cdot t_i = 0,$$

wherein $G_i$ represents the gradient amplitude and $t_i$ represents the gradient activation time, with i=x,y.

Figure 2D:
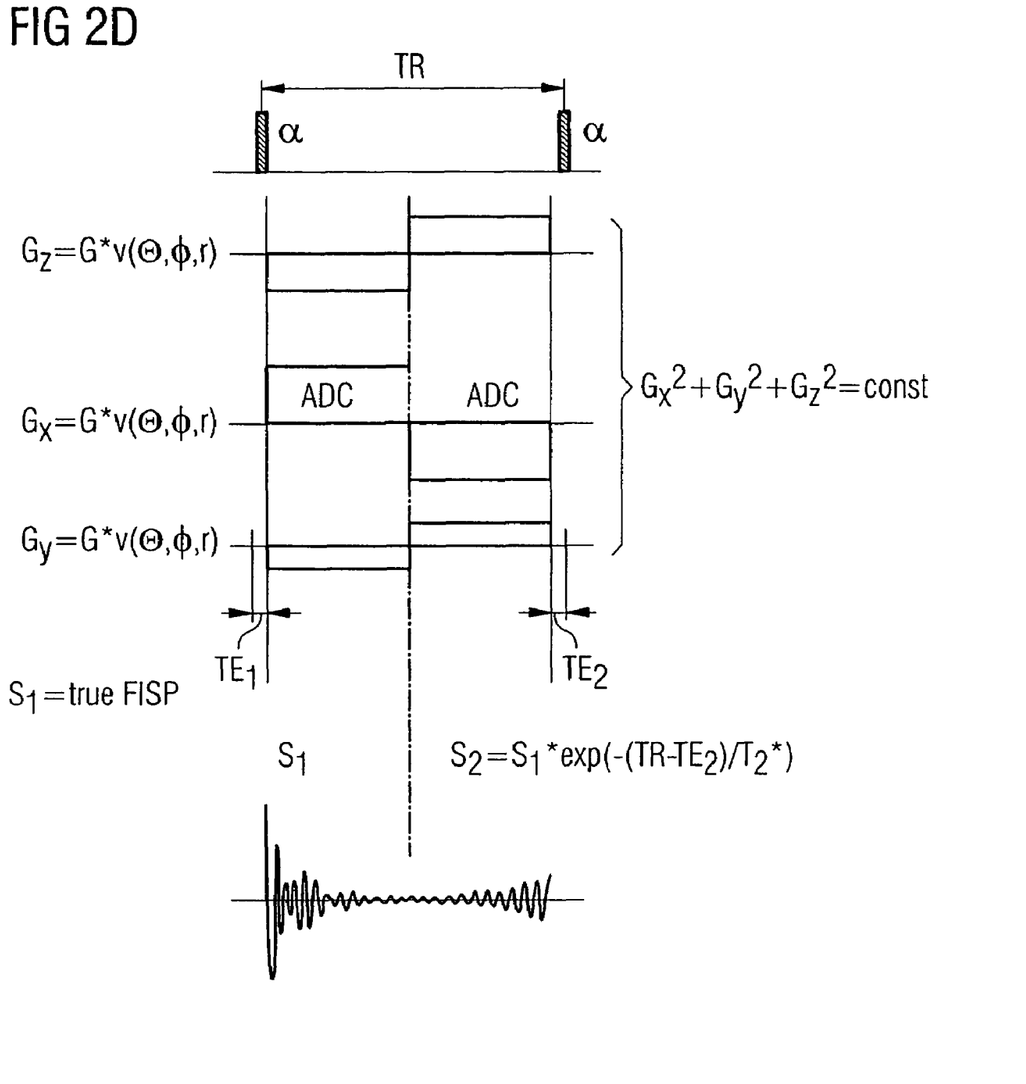
FIG. 2D schematically shows a True FISP sequence with projection gradients in all three spatial directions, suitable for use in the inventive method.

The sequence in FIG. 2D differs from the sequence in FIG. 2C only in that the projection reconstruction is three-dimensional. This means that the incrementing in the framework of the sampling ensues over the spherical coordinates $\Theta$, $\phi$, whereby the symmetry of the bipolarity accrues in the direction i=z.

Figure 2E:
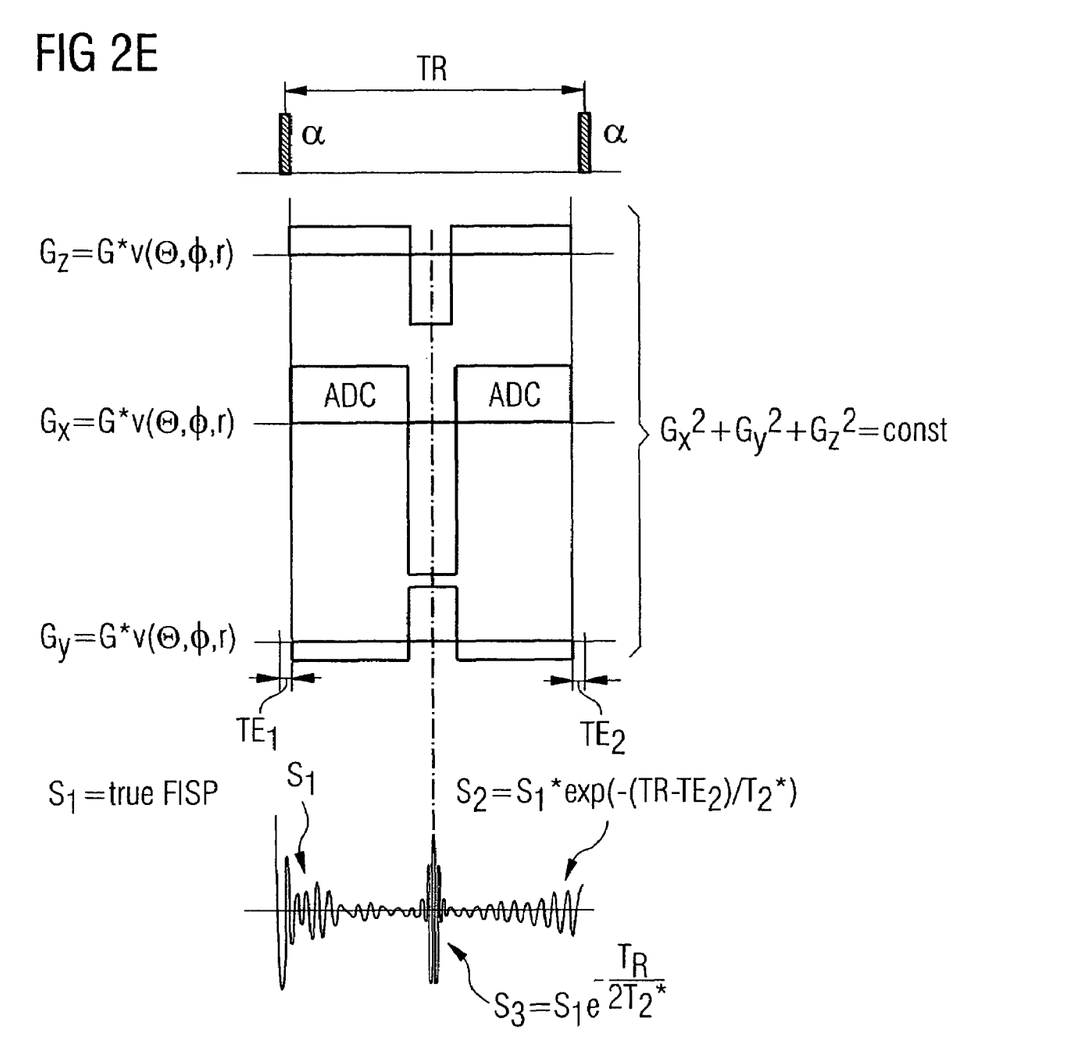
FIG. 2E schematically shows an axis-symmetrical True FISP sequence with projection gradients in all three spatial directions, suitable for use in the inventive method.

According to FIG. 2E, the gradients of all three spatial directions $G_x$, $G_y$, $G_z$ are switched in a multipolar manner (in this case three pulses alternating) given three-dimensional projection-reconstruction methods, whereby on the one hand the True FISP condition is given by $$\sum_i G_i \cdot t_i = 0 \text{ for } i = x, y, z,$$

and an axial symmetry of the sequence exists with regard to the middle axis of two RF pulses $$\left(\text{given } \frac{TR}{2}\right).$$

The latter leads to an additional axially-symmetrical echo signal $$S_3 := S_1 \cdot e^{-\frac{TR}{2T_2^*}}$$

at the site of the aforementioned axis of symmetry, which does not necessarily have to be evaluated or used, but which can possibly serve as a navigator signal. Overall a sequence according to FIG. 2E leads to a movement-insensitive signal acquisition.

As in the sequences according to FIGS. 2A and 2B, the contrast (for example fat-ligament-muscle) of the TE1 image that is obtained from $S_1$ with sequences according to FIGS. 2C, 2D or 2C is very small. The acquired image obtained from $S_2$ at the same time as $S_1$ give TE2 has a contrast similar to that of the $S_1$ image, but the signal from the tissue with very short transverse relaxation T2 is completely decayed at the point in time TE2 due to $T_2$ decay. Here as well tissue with very short $T_2$ can be exclusively, positively shown by a weighted subtraction of both data sets $S_1$ and $S_2$.

It is noted that the ADC readout time should be in the range of $T2_{short}$ in order to keep the resolution loss in the image due to asymmetrical $T_2$ filter effect on the measurement data low. For this reason the date acquisition should be made with a high readout bandwidth.

It should also be noted that the simultaneously acquired SSFP signals $S^+$, S, or $S_1$, $S_2$, are only usable when the quotient $$\frac{T_1}{T_2}$$

is not overly large, because otherwise the steady-state signal (in the case of very short $T_2$ times) gives way to a simple gradient echo signal and the signals $S^+$, $S^-$ and $S_1$, $S_2$ disappear.

Lastly, it should be mentioned that the echo times of the inventive sequences are small relative to $$t = \frac{\phi}{2\pi\gamma\delta B_0} \text{ given } \phi = \frac{\pi}{2},$$

which is why no interfering "opposed effects" will occur ($\delta$=3.3 ppm is the chemical shift value of fat protons to water protons).

As is generally known, gradient echo images can have signal obliteration artifacts at the locations where fat and water are contained in a volume element due to different phase positions of the magnetization vectors at the echo time TE. Since the S$^-$ signal has a spin-echo character, however, it always exhibits—with respect to the fat-water magnetization—an inverted phase relation relative to the S$^+$ signal.

A possibility to generally eliminate such obliteration artifacts in the first place to apply a very short, spectrally-selective but not spatially-selective RF excitation pulse, known as a $1_{\lambda,1}$–$1_{\lambda,2}$ RF excitation pulse with suitable phase position $\lambda$ between flip and return pulses (for example $\lambda_1$=0°, $\lambda_1$=130°).

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for generating data representing T2-weighted images of tissue with short T2 time in magnetic resonance tomography imaging, comprising the steps of:

operating a magnetic resonance data acquisition device to obtain magnetic resonance image data from a subject by exposing the subject to a steady-state free precession sequence with projection-reconstruction, in a plurality of sequence repetitions with a repetition time TR;

in each sequence repetition, emitting non-slice-selective RF excitation pulses and, in each direction of a spatial coordinate system, emitting gradient pulses selected from the group consisting of bipolar pulses that are point-symmetrical at TR/2, and multi-polar gradient pulses that are axially symmetrical at TR/2, and that have a surface area for each axis comprising a total value of 0;

in each sequence repetition, reading out a first steady-state signal as a True-FISP as a half echo with a short echo time TE$_1$, and reading out a second steady-state signal, separate from said first steady-state signal, as a T$_2$-weighted True-FISP signal as a further half echo with a short echo time TE$_2$=2 TR−TE$_1$, and combining said half echo and said further half echo by weighted addition to obtain a magnetic resonance tomography image of tissue in said subject with very short T$_2$ time of approximately 1 millisecond, from said sequence repetitions; and making said magnetic resonance data available as an output from said magnetic resonance data acquisition device in a form allowing processing of said magnetic resonance data to generate a T2-weighted magnetic resonance image of the subject therefrom.

2. A method as claimed in claim 1 comprising conducting said projection-reconstruction two-dimensionally with a 3D gradient in a slice direction.

3. A method as claimed in claim 1 comprising conducting a three-dimensional projection reconstruction using a spherical distribution function v($\theta$, $\phi$,r) with $\theta$,$\phi$, r as spherical coordinates.

4. A method as claimed in claim 1 comprising acquiring an echo signal at TR/2, and using said echo signal acquired at TR/2 as a navigator signal.

5. A method as claimed in claim 1 comprising, in said steady-state free precession sequence, generating gradient pulses each having a gradient amplitude, with a sum of the squares of said gradient amplitudes being constant.

6. A method as claimed in claim 1 comprising respectively projection-reconstructing said first steady-state signal and said second steady-state signal using a half-Fourier technique.

7. A method as claimed in claim 1 comprising employing echo times TE1 and TE2 each approximately 300 microseconds.

8. A method as claimed in claim 2 comprising generating said very short 3D gradient with a duation of approximately 500 microseconds.

9. A method as claimed in claim 1 comprising employing a repetition time TR of approximately 3 milliseconds.

10. A method as claimed in claim 1 comprising employing a T2 time in a range of several tens of milliseconds to seconds.

11. A magnetic resonance apparatus for determining T2-weighted images of tissue with short T2 time by tomographic imaging, comprising:

a magnetic resonance scanner adapted to interact with a subject in the scanner to obtain magnetic resonance image data from the subject by exposing the subject to a steady-state free precession sequence with non-slice-selective RF excitation pulses and projection-reconstruction, in a plurality of sequence repetitions with a repetition time TR;

a control unit connected to the scanner that operates the scanner to, in each sequence repetition, emit non-slice-selective RF excitation pulses and, in each direction of a spatial coordinate system, emit gradient pulses selected from the group consisting of bipolar pulses that are point-symmetrical at TR/2, and multi-polar gradient pulses that are axially symmetrical at TR/2, that have a surface area for each axis comprising a total value of 0;

said control unit further operating the scanner to, in each sequence repetition, read out a first steady-state signal as a half echo with a short echo time TE$_1$ and read out a second steady-state signal, separate from said first steady-state signal, as a further half echo with a short echo time TE$_2$ =2 TR−TE$_1$; and an image computer that combines said half echo and said further half echo by weighted addition to obtain a magnetic resonance tomography image of tissue in said subject with very short T2 time of approximately 1 millisecond, from said sequence repetitions.

* * * * *